(12) United States Patent
Kang et al.

(10) Patent No.: US 8,519,408 B2
(45) Date of Patent: Aug. 27, 2013

(54) METHOD OF FABRICATING A THIN FILM TRANSISTOR SUBSTRATE AND A PHOTOSENSITIVE COMPOSITION USED IN THE THIN FILM TRANSISTOR SUBSTRATE

(75) Inventors: Hoon Kang, Suwon-si (KR); Jae-sung Kim, Yongin-si (KR); Yang-ho Jung, Yongin-si (KR); Hi-kuk Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/599,518

(22) Filed: Aug. 30, 2012

(65) Prior Publication Data

US 2012/0328991 A1     Dec. 27, 2012

Related U.S. Application Data

(62) Division of application No. 12/170,487, filed on Jul. 10, 2008, now Pat. No. 8,278,021.

(30) Foreign Application Priority Data

Jul. 23, 2007 (KR) .................. 10-2007-0073496

(51) Int. Cl.
*G03C 1/72* (2006.01)
*G03C 7/00* (2006.01)
*C08J 3/28* (2006.01)

(52) U.S. Cl.
USPC ............... 257/72; 257/59; 257/87; 257/440; 438/142; 438/148; 430/270.1; 430/281.1; 430/280.1; 430/286.1; 430/287.1; 522/79; 522/120; 522/113; 522/114; 522/116; 522/121; 522/122; 522/150; 522/153; 522/154; 522/178; 522/181; 522/182; 522/129; 349/106

(58) Field of Classification Search
USPC .......... 430/270.1, 281.1, 280.1, 286.1, 287.1; 522/79, 100, 113, 114, 120, 121, 122, 150, 522/153, 154, 172, 178, 181, 182, 129, 116; 524/356, 366, 378, 379, 755, 761, 769, 770; 257/59, 79, 89, 440; 438/142, 148

See application file for complete search history.

(56) References Cited

U.S. PATENT DOCUMENTS

| | | | |
|---|---|---|---|
| 2,604,463 | A | 7/1952 | Bilton et al. |
| 3,058,947 | A | 10/1962 | Fryling et al. |
| 4,963,617 | A | 10/1990 | Fourquier et al. |
| 5,266,634 | A | 11/1993 | Ito et al. |
| 5,286,609 | A | 2/1994 | Numakura |
| 5,399,604 | A | 3/1995 | Sano et al. |
| 5,468,784 | A | 11/1995 | Yanagawa et al. |
| 5,484,850 | A | 1/1996 | Kempter et al. |
| 5,530,036 | A | 6/1996 | Sano et al. |
| 5,539,022 | A | 7/1996 | Schmidt et al. |
| 5,800,650 | A | 9/1998 | Anderson et al. |

(Continued)

FOREIGN PATENT DOCUMENTS

CN     1873534 A     12/2006

*Primary Examiner* — Sanza McClendon
(74) *Attorney, Agent, or Firm* — Cantor Colburn LLP

(57) ABSTRACT

Disclosed is a method of producing a thin film transistor substrate having high light sensitivity, heat-resistance, impact resistance, and a photosensitive composition used by the same, the method including forming data wires on an insulating substrate, forming an organic insulating film on the data wires by applying a photosensitive composition comprising a terpolymer, where the terpolymer is derived from monomers of an unsaturated carboxylic acid, an unsaturated carboxylic acid anhydride, or a mixture thereof, an unsaturated epoxy group-containing compound, and an olefinic compound.

13 Claims, 2 Drawing Sheets

(56) References Cited

U.S. PATENT DOCUMENTS

| | | |
|---|---|---|
| 6,680,158 B2 | 1/2004 | Li |
| 6,773,855 B1 | 8/2004 | Iijima et al. |
| 7,135,271 B2 | 11/2006 | Kawauchi et al. |
| 7,571,979 B2 | 8/2009 | Patil et al. |
| 7,829,180 B2 | 11/2010 | Ushiki et al. |
| 7,879,961 B2 | 2/2011 | Lee et al. |
| 2004/0063804 A1 | 4/2004 | Takeda et al. |
| 2004/0191690 A1 | 9/2004 | Hayakawa |
| 2005/0058934 A1 | 3/2005 | Kawauchi et al. |
| 2006/0063858 A1 | 3/2006 | Kang et al. |
| 2006/0275700 A1 | 12/2006 | Lee et al. |
| 2010/0178416 A1 | 7/2010 | Kang et al. |

_US 8,519,408 B2_

METHOD OF FABRICATING A THIN FILM TRANSISTOR SUBSTRATE AND A PHOTOSENSITIVE COMPOSITION USED IN THE THIN FILM TRANSISTOR SUBSTRATE

CROSS-REFERENCE TO RELATED PATENT APPLICATION

This application is a divisional application of U.S. application Ser. No. 12/170,487, filed on Jul. 10, 2008, which claims priority to Korean Patent Application No. 10-2007-0073496 filed on Jul. 23, 2007, and all the benefits accruing therefrom under 35 U.S.C. §119, the contents of which are herein incorporated by reference in their entirety.

BACKGROUND

1. Technical Field

Disclosed is a method of fabricating a thin film transistor substrate that comprises a photosensitive composition. The photosensitive composition is in the form of an organic film; the organic film having a high light sensitivity, a high heat-resistance, and good impact resistance.

2. Description of the Prior Art

Liquid crystal displays (LCDs) are one of the most widely used flat panel displays. Commercially available LCDs include two substrates on which electrodes are formed, and a liquid crystal layer that is interposed between the substrates. When a voltage is applied to the electrodes, the liquid crystal molecules of the liquid crystal layer change their alignment based on the resulting electric field, thus affecting the polarization of light and controlling the quantity of transmitted light.

An image is displayed on the LCD by applying individual voltages to respective pixel electrodes. To display an image, the pixel electrodes and associated wires and three-terminal TFTs (for switching voltages applied to the respective pixel electrodes), are provided on one of the two substrates (specifically a TFT substrate). In addition, an organic insulating film can be used to insulate the pixel electrodes and associated wires, thereby reducing the parasitic capacitance that can be created therebetween.

However, when the organic insulating film is used between the pixel electrodes and a plurality of wires, the process time for forming the organic insulating film adds to the TFT substrate processing time, thereby reducing production efficiency.

Accordingly, there remains a desire to provide an organic insulating film with reduced process time without reducing the performance of the organic insulating film.

BRIEF SUMMARY OF THE INVENTION

Disclosed is a method of fabricating a thin film transistor (TFT) substrate, which comprises an organic insulating film having a high light sensitivity, a high heat-resistance and a good impact resistance. Also disclosed is a photosensitive composition used to fabricate the thin film transistor (TFT) substrate. Additional features of the disclosed embodiments will be set forth in the description which follows.

Disclosed in an embodiment is a method of fabricating a thin film transistor substrate, the method comprising forming data wires on an insulating substrate, forming an organic insulating film on the data wires by applying a photosensitive composition, wherein the photosensitive composition comprises a terpolymer, the terpolymer being derived from an unsaturated carboxylic acid, an unsaturated carboxylic acid anhydride, or a mixture thereof, and an unsaturated epoxy group-containing compound, an olefinic compound, and about 5 to about 100 parts by weight of a positive type photosensitizer, based on 100 parts by weight of the terpolymer, about 5 to about 20 parts by weight of a plasticizer, based on 100 parts by weight of the terpolymer, and about 50 to about 90 parts by weight of a solvent, based on 100 parts by weight of the photosensitive composition; patterning contact holes in an organic insulating film; and forming pixel electrodes in the organic insulating film, the pixel electrodes being in electrical communication with the data wires via the contact holes.

In an alternative embodiment, a photosensitive composition comprises a terpolymer, wherein the terpolymer is derived from an unsaturated carboxylic acid, an unsaturated carboxylic acid anhydride, or a mixture thereof, and an unsaturated epoxy group-containing compound, and an olefinic compound; and about 5 to about 100 parts by weight of a positive type photosensitizer based on 100 parts by weight of the terpolymer; about 5 to about 20 parts by weight of a plasticizer, based on 100 parts by weight of the terpolymer; and about 50 to about 90 parts by weight of a solvent based on 100 parts by weight of the whole composition.

Other detailed aspects of the disclosed embodiments are included in the following detailed description and the accompanying drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the disclosed embodiments are apparent from the following detailed description taken in conjunction with the accompanying drawings in which:

Figure 1:
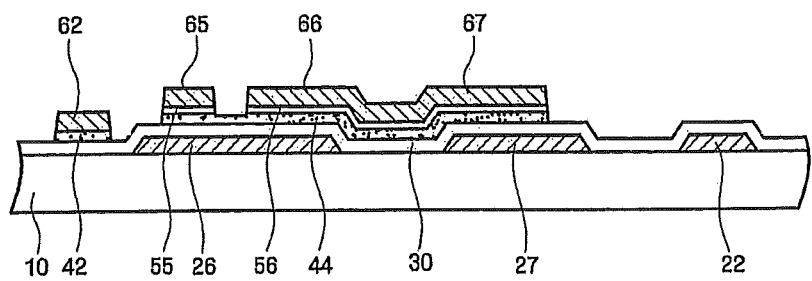
FIGS. 1 to 6 are cross-sectional views sequentially showing a method of fabricating a thin film transistor (TFT) substrate according to a disclosed embodiment.

The detailed description explains the preferred embodiments together with advantages and features, by way of example with reference to the drawings.

DETAILED DESCRIPTION OF THE INVENTION

Advantages and features of the disclosed methods can be understood more readily by reference to the following detailed description of exemplary embodiments and the accompanying drawings. The disclosed embodiments can, however, be embodied in many different forms and should not be construed as being limited to the embodiments set forth herein. Rather, these embodiments are provided so that this disclosure will be thorough and complete and will fully convey the concept of the disclosed embodiments to those skilled in the art, and the invention will only be defined by the appended claims. Like reference numerals refer to like elements throughout the specification.

As used herein, the singular forms "a", "an" and "the" are intended to include the plural forms as well, unless the context clearly indicates otherwise. The use of the terms "first", "second", and the like do not imply any particular order but are included to identify individual elements. It will be further understood that the terms "comprises" and/or "comprising," or "includes" and/or "including" when used in this specification specify the presence of stated features, regions, integers, steps, operations, elements, and/or components, but do not preclude the presence or addition of one or more other features, regions, integers, steps, operations, elements, components, and/or groups thereof.

It will be understood that when an element or a layer is referred to as being "on" or "connected to" another element or layer, it can be directly on or directly connected to the other element, or intervening elements can also be present. In contrast, when an element is referred to as being "disposed on", "formed on", "directly on" or "directly connected to" another element, the elements are understood to be in at least partial contact with each other, unless otherwise specified.

Spatially relative terms, such as "beneath", "below", "lower", "above", "upper" and the like, can be used herein for ease of description to describe one element or a feature's relationship to other element(s) or feature(s) as illustrated in the figures. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. The terms "front", "back", "bottom", and/or "top" as used herein, unless otherwise noted, are merely for convenience of description, and are not limited to any one position or spatial orientation.

Hereinafter, a photosensitive composition according to a disclosed embodiment will be described in detail.

An embodiment of the photosensitive composition comprises a terpolymer, a positive type photosensitizer, a plasticizer, and a solvent, wherein the terpolymer comprises an unsaturated carboxylic acid, an unsaturated carboxylic acid anhydride, or a mixture thereof, an unsaturated epoxy group-containing compound, and an olefinic compound.

Thus the terpolymer is a copolymer of an unsaturated carboxylic acid, an unsaturated carboxylic acid anhydride or a mixture thereof, an unsaturated epoxy group-containing compound and an olefinic compound.

Exemplary carboxylic acids and unsaturated carboxylic acid anhydrides that can be used to produce the terpolymer include unsaturated monocarboxylic acids, including acrylic acid and methacrylic acid, and the like, or unsaturated dicarboxylic acids, including maleic acid, fumaric acid, citraconic acid, methaconic acid, itaconic acid, and the like, or unsaturated dicarboxlylic acid anhydrides, or the like, or combinations comprising at least one of the foregoing acids and/or anhydrides.

The content of the unsaturated carboxylic acid, unsaturated carboxylic acid anhydride, or a mixture thereof, can be about 5 to about 40 parts by weight, specifically about 10 to about 30 parts by weight, more specifically about 15 to about 25 parts by weight, based on 100 parts by weight of the unsaturated carboxylic acid, unsaturated carboxylic anhydride, unsaturated epoxy group-containing compound and olefinic compound. When the content of the unsaturated carboxylic acid and/or anhydride is less than about 5 parts by weight, the solubility of the photosensitive composition in an aqueous alkaline solution can be too low. In the contrast, when the content is more than about 40 parts by weight, the solubility of the photosensitive composition in an aqueous alkaline solution can be too high.

Exemplary unsaturated epoxy group-containing compounds include acrylic acid glycidyl, methacrylic acid glycidyl, α-ethylacrylic acid glycidyl, α-n-propylacrylic acid glycidyl, α-n-butylacrylic acid glycidyl, acrylic acid-β-methylglycidyl, acrylic acid-β-ethylglycidyl, methacrylic acid glycidyl such as methacrylic acid-β-methylglycidyl and methacrylic acid-β-ethylglycidyl; acrylic acid-3,4-epoxy butyl, methacrylic acid-3,4-epoxy butyl, acrylic acid-6,7-epoxy heptyl, methacrylic acid-6,7-epoxy heptyl, α-ethylacrylic acid-6,7-epoxy heptyl, o-vinylbenzylglycidylether, m-vinylbenzylglycidylether, or p-vinylbenzylglycidylether, methacrylic acid 3,4-epoxy cyclohexyl, and the like, or a combination comprising at least one of the foregoing epoxy group-containing compounds. Specifically, in consideration of the copolymerization reactivity and desired improvement of heat-resistance of a pattern formed of the photosensitive composition, exemplary epoxy group-containing compounds include methacrylic acid glycidyl, methacrylic acid-β-methylglycidyl, methacrylic acid-6,7-epoxy heptyl, o-vinylbenzylglycidylether, m-vinylbenzylglycidylether, or p-vinylbenzylglycidylether, methacrylic acid 3,4-epoxy cyclohexyl.

The unsaturated epoxy group-containing compound can be contained in an amount of about 10 to about 70 parts by weight, specifically about 20 to about 60 parts by weight, more specifically about 30 to about 50 parts by weight, based on 100 parts by weight of the aforementioned three monomers. When the content of the unsaturated epoxy group-containing compound is less than 10 parts by weight, heat-resistance of the formed pattern can be reduced. When the content of the unsaturated epoxy group-containing compound is more than 70 parts by weight, the storage stability of copolymer can be reduced.

Exemplary olefinic compounds include acrylate-based compounds, diene-based aliphatic compounds, and aromatic compounds, or the like, or a combination comprising at least one of the foregoing olefinic compounds.

Exemplary acrylate-based compounds include methylmethacrylate, ethylmethacrylate, n-butyl methacrylate, sec-butyl methacrylate, tert-butyl methacrylate, methylacrylate, isopropyl acrylate, cyclohexyl methacrylate, 2-methylcyclohexylmethacrylate, dicyclopentenylacrylate, dicyclopentanylacrylate, dicyclopentenylmethacrylate, dicyclopentanylmethacrylate, 1-adamantyl acrylate, 1-adamantyl methacrylate, dicyclopentanyloxyethylmethacrylate, isoboronylmethacrylate, cyclohexylacrylate, 2-methylcyclohexylacrylate, dicyclopentanyloxyethylacrylate, isoboronylacrylate, phenylmethacrylate, phenylacrylate, benzylmethacrylate, benzylacrylate, 2-hydroxyethylmethacrylate, or the like, or a combination comprising at least one of the foregoing acrylate based compounds.

Exemplary diene-based aliphatic compounds include 1,3-butadiene, isoprene, or 2,3-dimethyl 1,3-butadiene, and the like, or a combination comprising at least one of the foregoing diene-based aliphatic compounds.

Exemplary aromatic compounds include styrene, 6-methyl styrene, m-methyl styrene, p-methyl styrene, vinyltoluene, p-methoxy styrene, or the like, or a combination comprising at least one of the foregoing aromatic compounds.

In consideration of copolymerization reactivity and the solubility in an aqueous alkaline developer solution, exemplary olefinic compounds are styrene, dicyclopentanylmethacrylate, and p-methoxy styrene.

The content of an olefinic compound can be about 10 to about 70 parts by weight, specifically about 20 to about 50 parts by weight, more specifically about 30 about 40 parts by weight based on 100 parts by weight of the unsaturated carboxylic acid, unsaturated carboxylic anhydride, unsaturated epoxy group-containing compound and olefinic compound.

When the content of the olefinic compound is less than about 10 parts by weight, the storage stability of acrylic copolymer can be reduced. In the contrast, when the content of the olefinic compound is more than about 70 parts by weight, the solubility of the photosensitive composition in an aqueous alkaline developer solution can be reduced.

Prior to forming the terpolymer, about 5 to about 40 parts by weight of the unsaturated carboxylic acid, the unsaturated carboxylic acid anhydride, or mixture thereof, about 10 to about 70 parts by weight of the unsaturated epoxy group-containing compound, and about 5 to about 70 parts by weight of the olefinic compound, based on 100 parts by weight of the unsaturated carboxylic acid, unsaturated carboxylic anhydride, unsaturated epoxy group-containing compound and olefinic compound, are solution polymerized in a solvent to form a copolymer mixture.

For example, a methacrylic acid of formula 1 (as the monomer), a methacrylic acid glycidyl of formula 2 (as the monomer), and benzyl methacrylate of formula 3 (as the monomer) can be copolymerized in the presence of the solvent in the aforementioned content ratios.

Formula 1

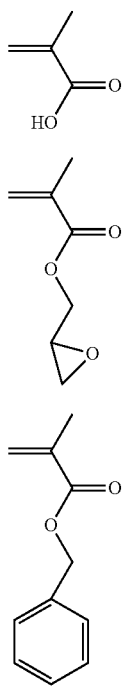

Formula 2

Formula 3

Exemplary polymerization solvents used in the solution polymerization include methanol, tetrahydroxyfuran, toluene, and dioxane or the like, or a combination comprising at least one of the foregoing solvents.

A polymerization initiator, such as a radical polymerization initiator, can be used in the copolymerization reaction. Exemplary polymerization initiators are 2,2-azobisbutyronitrile, 2,2-azobis(2,4-dimethylvaleronitrile), 2,2-azobis(4-methoxy 2,4-dimethylvaleronitrile), 1,1-azobis(cyclohexane-1-carbonitrile), and dimethyl 2,2'-azobisisobutylate, or the like, or a combination comprising at least one of the foregoing polymerization initiators.

Next, the copolymer mixture formed by the above polymerization is precipitated, filtered, and vacuum dried to remove unreacted monomers. As a result, an acrylic terpolymer, substantially free of unreacted monomers, is formed.

The terpolymer is a polymer of formula 4a:

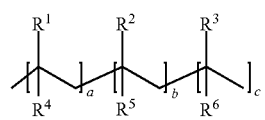

Formula 4a where $R^1$ to $R^6$ are each independently hydrogen, a carboxylic acid group, an epoxy ester group, an aliphatic ester group or an aryl containing ester group, where each of $R^1$ to $R^6$ can be the same or different, and where a, b and c can each independently be 0 or can each independently be greater than or equal to 1.

Specifically, in one exemplary embodiment $R^1$ is a carboxylic acid group, $R^2$ is an epoxy ester group and $R^3$ is an alkylaryl ester group. In another exemplary embodiment, $R^1$ to $R^6$ include at least one carboxylic acid group, one epoxy ester group, and one aliphatic ester group or one aryl containing ester group. In an exemplary embodiment, the acrylic terpolymer can have the structure of formula 4b.

Formula 4b

The polystyrene reduced-weight average molecular weight of acrylic terpolymer containing the above described constituents can be about 5,000 to about 30,000 daltons, specifically about 5,000 to about 20,000 daltons. When the polystyrene reduced-weight average molecular weight of the terpolymer is less than about 5,000 daltons, the ability to form an organic insulating film containing the acrylic terpolymer, as described by the residual film formation rate, which is the amount of organic insulating film remaining after a developing process, and the heat-resistance of the organic insulating film, can be reduced. In the contrast, when the polystyrene reduced-weight average molecular weight of the terpolymer is more than about 30,000 daltons, the sensitivity of an organic insulating film to light and the ability of the terpolymer to form a pattern can be reduced.

Moreover, the acrylic copolymer avoids the formation of scum that is form during the organic insulating film manufacturing process.

The photosensitizer included in the disclosed photosensitive composition can be a positive type photosensitizer. Exemplary positive type photosensitizers are quinonediazide compounds, specifically. 1,2-quinonediazide compounds, such as 1,2-quinonediazide 4-sulphonic acid ester, 1,2-quinonediazide 5-sulphonic acid ester, 1,2-quinonediazide 6-sulphonic acid ester, or the like, or a combination comprising at least one of the foregoing quinonediazide compounds.

A quinonediazide compound can be formed by reacting a naphthoquinonediazide sulphonic acid halogen compound with a phenol compound. Exemplary phenol compounds used to produce a quinonediazide compound include 2,3,4-trihydroxybenzophenone, 2,4,6-trihydroxybenzophenone, 2,2'-tetrahydroxybenzophenone, 4,4'-tetrahydroxybenzophenone, 2,3,4,3'-tetrahydroxybenzophenone, 2,3,4,4'-tetrahydroxybenzophenone, 2,3,4,2'-tetrahydroxy 4'-methylbenzophenone, 2,3,4,4'-tetrahydroxy 3'-methoxybenzophenone, 2,3,4,2'-pentahydroxybenzophenone, 2,3,4,6'-pentahydroxybenzophenone, 2,4,6,3'-hexahydroxybenzophenone, 2,4,6,4'-hexahydroxybenzophenone, 2,4,6,5'-hexahydroxybenzophenone, 3,4,5,3'-hexahydroxybenzophenone, 3,4,5,4'-hexahydroxybenzophenone, 3,4,5,5'-hexahydroxybenzophenone, bis(2,4-dihydroxyphenyl)methane, bis(p-hydroxyphenyl)methane, tri(p-hydroxyphenyl)methane, 1,1,1-tri(p-hydroxyphenyl)ethane, bis(2,3,4-trihydroxyphenyl)methane, 2,2-bis(2,3,4-trihydroxyphenyl)propane, 1,1,3-tris(2,5-dimethyl 4-hydroxyphenyl)-3-phenylpropane, 4,4'-[1-[4-[1-[4-hydroxyphenyl]-1-methyl ethyl]phenyl]ethylidene]bisphenol, bis(2,5-dimethyl 4-hydroxyphenyl)-2-hydroxyphenylmethane, or the like, or a combination comprising at least one of the foregoing compounds.

Hereinafter, a method of fabricating a quinonediazide compound will be described. A naphthoquinonediazide sulphonic acid halogen compound, such as the naphthoquinonediazide sulphonic acid chloride of formula 5, and a phenol, such as the 2,3,4,4'-tetrahydroxybenzophenone of formula 6 are reacted in an esterification reaction to provide the 1,2-quinonediazide compound of formula 7.

Formula 5

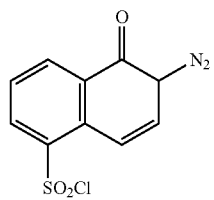

Formula 6

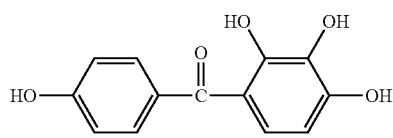

Formula 7

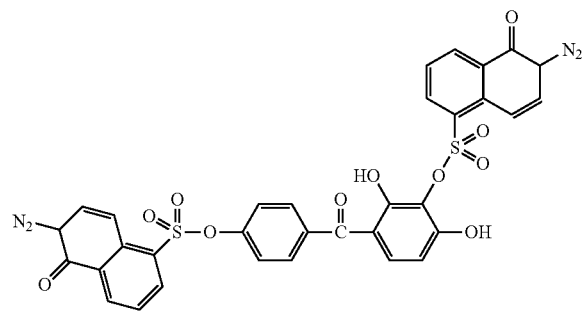

When a phenol compound is reacted with a naphthoquinonediazide sulphonic acid halogen compound to synthesize a quinonediazide compound, the degree of esterification is specifically about 50 to about 85 percent. When the degree of esterification is less than about 50 percent, the residual film rate can be reduced. In the contrast, when the degree of esterification is more than about 85 percent the storage stability can be reduced.

The quinonediazide compound is contained in an amount of about 5 to about 100 parts by weight, specifically in an amount of about 10 to about 50 parts by weight, more specifically in an amount of about 20 to about 40 parts by weight, based on 100 parts by weight of the acrylic copolymer. When the content of the quinonediazide compound is less than about 5 parts by weight, the solubility difference between an exposed portion and an unexposed portion can be decreased, which makes it hard to form a pattern. In contrast, when the content of the quinonediazide compound is more than about 100 parts by weight, a portion of the 1,2-quinonediazide compound can remain unreacted after a short exposure, and this causes the solubility in aqueous alkaline developer solution to deteriorate, thus making it hard to develop the film.

The plasticizer included in an embodiment of the disclosed photosensitive composition can be selected from the group consisting of phthalates, adipates, phosphates, monoisobutyrates, and the like, and a combination comprising at least one of the foregoing plasticizers.

Specifically, phthalates can be selected from the group consisting of dioctylphthalate and diisononylphthalate, and the like, adipates can include dioctyladipate, and the like, phosphates can be selected from the group consisting of adipates and tricresylphospate, and the like, and monoisobutyrates can include 2,2,4-trimethyl-1,3-pentanediol monoisobutyrates, and the like.

The plasticizers control the crosslinking density of the organic insulating film, and maintain the high sensitivity of the photosensitive composition to light. Specifically, the plasticizers prevent the photosensitive composition from crosslinking and increase the solubility of the photosensitive composition in the developer. Accordingly, even if the photosensitive composition to which the plasticizer is added is exposed to a small amount of light, relative to the photosensitive composition to which the plasticizer is not added, the photosensitive composition with plasticizer can be dissolved by a developer, thus increasing light sensitivity.

The plasticizer can be contained in an amount of about 5 to about 20 parts by weight based on 100 parts by weight of the terpolymer. When the content is less than about 5 parts by weight, it is hard to control the crosslinking density of the photosensitive composition. In the contrast, when the content is more than about 20 parts by weight, heat-resistance of the photosensitive composition can be reduced.

The solvent used in an embodiment can maintain the uniformity of the organic insulating film, prevent a coating spot, and form a uniform pattern profile. The solvent included in the photosensitive composition can be selected from the group consisting of alcohols, including methanol, ethanol, benzylalcohol, or hexylalcohol; ethylene glycolalkyletheracetates including ethylene glycolmethyletheracetateor ethylene glycolethyletheracetate; ethylene glycolalkyletherpropionates including ethylene glycolmethyletherpropionate, or ethylene glycolethyletherpropionate; ethylene glycolmonoalkylethers including ethylene glycolmethylether, or ethylene glycolethylether; diethylene glycolalkylethers including diethylene glycolmonomethylether, diethylene glycolmonoethylether, diethylene glycoldimethylether, or diethylene glycolmethylethylether; propyleneglycolalkyletheracetates including propyleneglycolmethyletheracetate, propyleneglycolethyletheracetate, or propyleneglycolpropyletheracetate; propyleneglycolalkyletherpropionates including propyleneglycolmethyletherpropionate, propyleneglycolethyletherpropionate, or propyleneglycolpropyletherpropionate; propyleneglycolmonoalkylethers including propyleneglycolmethylether, propyleneglycolethylether, propyleneglycolpropylether, or propyleneglycolbutylether; dipropyleneglycolalkylethers including dipropyleneglycoldimethylether or dipropyleneglycoldiethylether; butyleneglycolmonomethyl ethers including butyleneglycolmonomethylether, or butyleneglycolmonoethylether; and dibutyleneglycolalkylethers including dibutyleneglycoldimethyl ether, and dibutyleneglycoldiethylether, and the like, and a combination comprising at least one of the foregoing compounds.

The solvent can be contained in an amount of about 50 to about 90 parts by weight, specifically about 60 to about 85 parts by weight, more specifically about 65 to about 80 parts by weight, based on 100 parts by weight of the entire photosensitive composition. That is, the solvent is added to the mixture of the terpolymer, the photosensitizer, and the plasticizer, such that the solids content of the photosensitive composition is about 10 to about 50 parts by weight, specifically about 15 to about 40 parts by weight, more specifically about 20 to about 35 parts by weight of the entire photosensitive resin composition. When the solids content of the photosensitive composition is less than about 10 parts by weight, an organic insulating film comprising the photosensitive composition can be too thin or have poor coating uniformity. In the contrast, when the solids content of the photosensitive composition is more than about 50 parts by weight, the coating thickness can be too thick, or a coating apparatus can have difficulty providing a uniform coating.

The photosensitive composition containing the above constituents can further comprise an additive selected from the group consisting of an epoxy compound, an adhesive, an acrylic compound, a surfactant, and the like, and a combination of at least one of the foregoing additives, to suit individual circumstances.

The epoxy compound enhances heat-resistance and light sensitivity of an organic insulating film pattern formed using the photosensitive composition.

Exemplary epoxy compounds include a bisphenol-A-type epoxy compound, a phenol novolac-type epoxy compound, a cresol-novolac-type epoxy compound, a cyclic aliphatic epoxy compound, a glycidyl-ester-type epoxy compound, a glycidyl amine type epoxy compound, a heterocyclic epoxy compound, a glycidyl methacrylate (co)polymerized compound, and the like, and a combination of at least one of the foregoing compounds. Specifically, a bisphenol-A-type epoxy compound, a cresol-novolac-type epoxy compound, or a glycidyl-ester-type epoxy compound can be used.

The content of the epoxy compound can be about 0.1 to about 30 parts by weight based on 100 parts by weight of the terpolymer. When the content of the epoxy compound is less than about 0.1 or greater than about 30 parts by weight, the compatibility between the terpolymer and the acrylic copolymer can deteriorate and make it hard to apply the photosensitive composition on a substrate.

In addition, the disclosed adhesive can enhance adhesion between the photosensitive composition and the insulating substrate. The content of the adhesive can be about 0.1 to about 20 parts by weight based on 100 parts by weight of the terpolymer.

Exemplary adhesives include silane-coupling agents having a reactive substituent, for example a carboxyl group, methacryl group, isocyanate group, an epoxy group, or the like, or a combination of at least one of the foregoing substituents. Exemplary adhesives include γ-methacryloxypropyltrimethoxysilane, vinyltriacetoxysilane, vinyltrimethoxysilane, γ-isocyanatepropyltriethoxysilane, γ-glycidoxypropyltrimethoxysilane, and β-(3,4-epoxy cyclohexyl)ethyltrimethoxysilane.

In addition, the acrylic compound used as an additive can enhance the transmittance, heat-resistance, and light sensitivity of an organic insulating film pattern formed with the disclosed photosensitive composition.

The acrylic compound can be of formula 8.

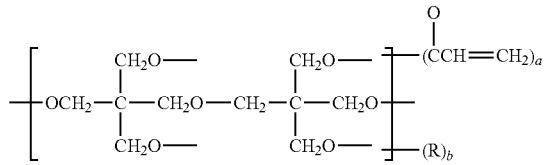

Formula 8

In formula 8, R is a hydrogen atom, C1-C5 alkyl group, C1-C5 alkoxy group, or C1-C5 alkanoyl group, where $1<a<6$ and $a+b=6$.

The acrylic compound, when used as an additive, can be contained in an amount of about 0.1 to about 30 parts by weight, specifically about 0.1 to about 15 parts by weight, based on 100 parts by weight of the terpolymer. When the content of the acrylic compound is between about 0.1 and about 15 parts by weight, the heat-resistance and light sensitivity of the organic insulating film pattern formed using the photosensitive composition can be enhanced.

The disclosed surfactant enables the photosensitive composition to be applied as a uniform film and developed.

Exemplary surfactants include polyoxyethyleneoctylphenylether, or polyoxyethylenenonylphenylether; surfactants marketed by DaiNippon Ink & Chemicals Inc. under the trade names F171, F172, and F173, surfactants marketed by Sumitomo Chemical Company under the trade names FC430 or FC431, or surfactants marketed by Shin-Etsu Chemical Co. under the trade name KP341, and the like, or a combination comprising at least one of the foregoing surfactants.

The surfactant can be contained in an amount of about 0.0001 to about 2 parts by weight, based on 100 parts by weight of the terpolymer. When the content is between about 0.0001 and about 2 parts by weight, the photosensitive composition can be applied as a uniform film and developed.

The solids content of the photosensitive composition, including said additive, can be preferably about 10 to about 50 parts by weight based on 100 parts by weight of the photosensitive composition. The solids can be dissolved in the solvent and filtered using a MILLIPORE® filter having pore size of about 0.1 to about 0.2 micrometers to produce the photosensitive composition.

Hereinafter, referring to FIGS. 1 to 6, a thin film transistor substrate according to an embodiment will be described in detail. FIGS. 1 to 6 are exemplary sequential cross-sectional views showing a method of fabricating a TFT substrate according to a disclosed embodiment. In this embodiment, the above-described photosensitive composition is used. Therefore, in the following explanation, the description of the photosensitive composition is simplified.

Referring to FIG. 1, a metal layer (not shown) that is used for gate wires is laminated on an insulating substrate 10. The metal layer is patterned so as to form gate wires which are composed of gate line 22, gate electrode 26 and storage electrode 27. The gate line 22 is formed on the insulating substrate 10, for example, in a transverse direction. The gate electrode 26 is in electrical communication with, and protrudes from, the gate line 22. Subsequently, a gate insulating film 30, which can be made of silicon nitride (SiNx), is deposited on insulating substrate 10 and the gate wires by, for example, a plasma enhanced chemical vapor deposition method (PECVD) or reactive sputtering method. Further, an active layer (not shown), a doped amorphous silicon layer (not shown) and a conductive layer for data wiring (not shown) are sequentially deposited on the gate insulating film 30 by, for example, a sputtering method. Next these layers are etched to form data wires which are composed of a data line 62, source electrode 65, drain electrode 66, and drain electrode expanding portion 67, in addition to ohmic contact layers 55 and 56, and active layer patterns 42 and 44.

Figure 2:
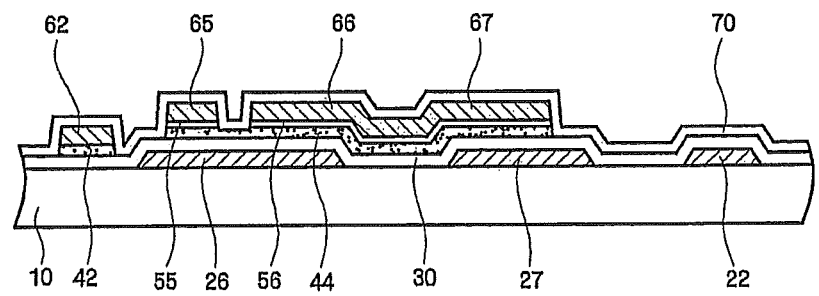

Next, referring to FIG. 2, a passivation film 70 is formed on the data wires (62, 65, and 66, and 67) and gate insulating film 30, by depositing an inorganic material, such as silicon nitride (SiNx) or silicon oxide (SiOx).

Figure 3:
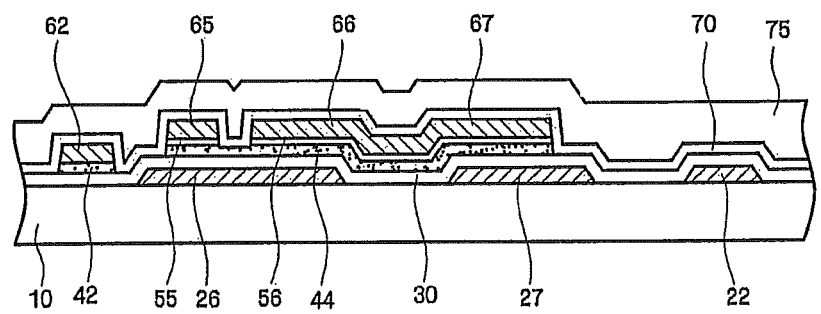

Next, referring to FIG. 3, the photosensitive composition according to an embodiment is applied on the passivation film 70.

To produce a photosensitive composition, as described above, about 5 to about 40 parts by weight of the unsaturated carboxylic acid, the unsaturated carboxylic acid anhydride, or the mixture thereof, about 10 to about 70 parts by weight of the unsaturated epoxy group-containing compound, and about 5 to about 70 parts by weight of the olefinic compound, based on 100 parts by weight of the unsaturated carboxylic acid, unsaturated carboxylic anhydride, unsaturated epoxy group-containing compound and olefinic compound, are solution polymerized, and unreacted monomers removed to form a terpolymer. Next, the terpolymer, a positive type photosensitizer, in an amount of about 5 to about 100 parts by weight, based on 100 parts by weight of the terpolymer, and a plasticizer, in an amount of about 5 to about 20 parts by weight based on 100 parts by weight of the terpolymer, are dissolved in about 50 to about 90 parts by weight of a solvent based on 100 parts by weight of the terpolymer, plasticizer and solvent composition to form the photosensitive composition.

The photosensitive composition is then applied to the surface of the substrate via a spray method, roll coating method, spin coating method, and the like, and pre-baked to remove the solvents and form a photosensitive composition layer 75. In this case the pre-bake is performed at a temperature of about 80 to about 115° C., specifically about 85 to about 110° C., more specifically about 90 to about 115° C. for about 1 to about 15 minutes, specifically about 2 to about 13 minutes, more specifically about 5 to about 10 minutes.

Figure 4:
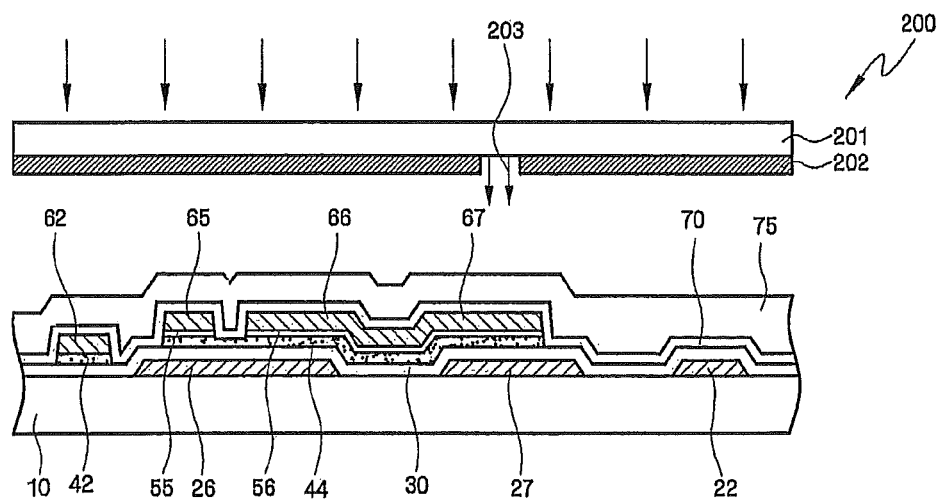

Next, referring to FIG. 4, an exposure is carried out by irradiating with a light, such as visible light, ultraviolet light, far ultraviolet light, or other type of electromagnetic radiation, such as an electron beam, or X-rays, and the like, on the photosensitive composition layer 75 using a mask 200.

The mask 200 comprises light shielding patterns 202 formed of chromium (Cr) on the transparent substrate 201, and an aperture 203 formed between light-shielding patterns 202. Because the photosensitizer included in the photosensitive composition is a positive type photosensitizer, the portion of the photosensitive composition irradiated with light via aperture 203 is reacted so it can be removed in a developing process. In this case the sensitivity of the organic insulating film 75 to the light used in irradiation can be, for example, about 200 to about 270 milliJoules per square centimeter (mJ/cm$^2$). As described above, the organic insulating film 75 may have high light sensitivity, thus the developing time can be shortened.

Next, the organic insulating film 75 is developed using a developer to form a pattern. Exemplary developers include aqueous alkaline solutions. The aqueous alkaline solution can be formed of an alkali compound dissolved in water. The alkali compound can be at least one selected from the group consisting of inorganic alkalis, including sodium hydroxide, potassium hydroxide, and sodium carbonate and the like; primary amines, including ethylamine, and n-propylamine, and the like; secondary amines including diethylamine, and n-propylamine, and the like; tertiary amines, including trimethylamine, methyldiethylamine, dimethylethylamine, and triethylamine, and the like; alcoholamines including dimethylethanolamine, methyldiethanolamine, and triethanolamine, and the like; and quaternary ammonium salts including tetramethylammonium hydroxide, tetraethylammonium and hydroxide, and the like, or a combination comprising at least one of the foregoing alkali compounds. In this case, the developer can contain about 0.1 to about 10 parts by weight of the alkali compound, per 100 parts by weight of the developer and about 90 to about 99.9 parts by weight of water, per 100 parts by weight of the developer. In addition, a soluble organic solvent, such as, methanol, or ethanol, and the like, and surfactant, can be added to the developer.

Figure 5:
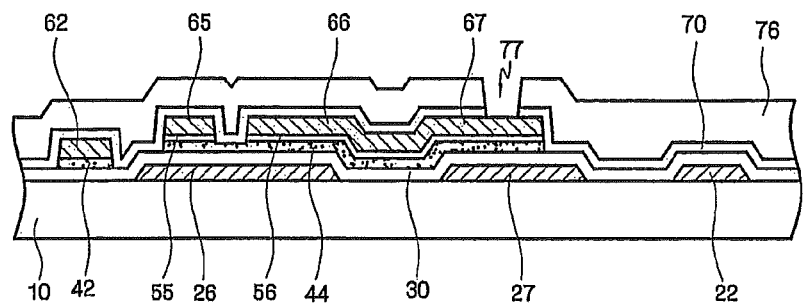

Next, the developed the organic insulating film 75 is rinsed using deionized water for about 30 to about 90 seconds, specifically about 40 to about 80 seconds, and dried to form a pattern for forming a contact hole (see 77 of FIG. 5). Then the patterned organic insulating film 75 is further irradiated using light, specifically ultraviolet light. Next, the further irradiated organic insulating film 75 is heat treated and cured for about 30 to about 90 minutes at a temperature of about 150 to about 250° C., specifically about 160 to about 240° C., more specifically about 170 to about 230° C. using a heating apparatus, such as a convection oven, to provide an organic insulating film pattern 76 which includes a contact hole, as shown in FIG. 5.

Figure 6:
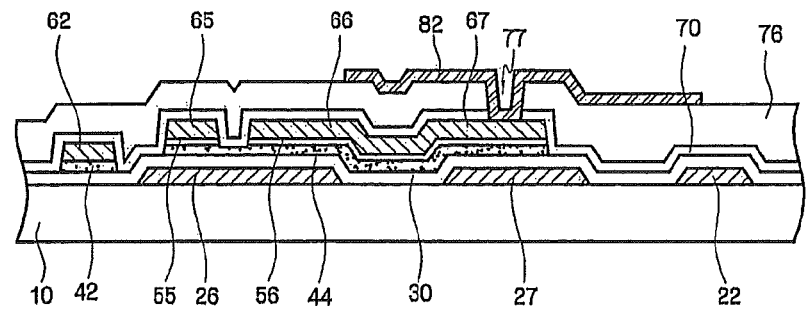

The organic insulating film pattern 76, formed by the above described process, comprises the photosensitive composition, and provides high uniformity, resolution, heat-resistance, transmittance, impact resistance, and light sensitivity. Consequently, exposure time, thus process time, can be reduced to improve productivity. Next, as shown in FIG. 6, transparent conductors, such as indium tin oxide (ITO) and indium zinc oxide (IZO) are deposited and patterned to form a pixel electrode 82, thereby completing a thin film transistor substrate.

The pixel electrode 82 is in electrical communication, through the contact hole 77, with drain electrode expanding portion 67.

The pixel electrode 82, and the storage electrode 27, form a storage capacitance. The data wires (62, 65, 66, and 67) and the pixel electrode 82 can create undesirable parasitic capacitance. However, this parasitic capacitance can be reduced by the disclosed organic insulating film pattern 76. The process time for forming an organic insulating film pattern 76 can be reduced by using the disclosed photosensitive composition.

Hereinafter, the performance of the photosensitive composition, and a thin film transistor substrate formed by a method using the photosensitive composition, is further illustrated by the following non-limiting Experimental Examples and Comparative

EXPERIMENTAL EXAMPLES

Experimental Example 1

Preparation of Acrylic Terpolymer

A monomer mixture comprising 25 parts by weight of methacrylic acid, 30 parts by weight benzyl methacrylate, 25 parts by weight of methacrylic acid glycidyl, and 20 parts by weight of styrene, and solvent, 400 parts by weight of tetrahydroxyfuran, based on 100 parts by weight of the monomer mixture, 10 parts by weight of 2,2'-azobis (2,4-dimethylvaleronitrile), based on 100 parts by weight of the monomer mixture, were mixed in a flask equipped with a stirrer and a cooling leg, and the flask flushed with nitrogen while stirring slowly. The stirred solution was then heated to a temperature of 62° C. and maintained at that temperature for 10 hours to produce a copolymer mixture.

To remove unreacted monomer from the copolymer mixture, to 100 parts by weight of the copolymer mixture were added 1000 parts by weight of n-hexane to precipitate the copolymer. Next, the copolymer mixture was filtered using a mesh to remove the portion of the solvent in which some unreacted monomers remained dissolved. Next, a vacuum drying process was performed at 30° C. to remove all solvent and any unreacted monomer remaining after the filtering process, thereby producing acrylic terpolymer.

The weight average molecular weight of the acrylic terpolymer was 10,000 daltons when determined as a polystyrene reduced-weight average molecular weight measured using Gel Permeation Chromatography (GPC.

(Production the 1,2-quinonediazide Compound)

One mole of 4,4'-[1-[4-[1-[4-hydroxyphenyl]-1-methylethyl]phenyl]ethylidene]bisphenol and 2 moles of 1,2-naphthoquinonediazide-5-sulphonic acid[chloride] were condensation-polymerized to produce 4,4'-[1-[4-[1-[4-hydroxyphenyl]-1-methyl ethyl]phenyl]ethylidene] bisphenol 1,2-naphthoquinonediazide-5-sulphonic acid ester.

(Production of the Photosensitive Composition)

One hundred parts by weight of the acrylic terpolymer, and 25 parts by weight of 4,4'-[1-[4-[1-[4-hydroxyphenyl]-1-methyl ethyl]phenyl]ethylidene]bisphenol 1,2-naphthoquinonediazide-5-sulphonic acid ester and 15 parts by weight of dioctylphthalate plasticizer, based on 100 parts by weight of the terpolymer, were mixed. Diethylene glycol dimethylether was added to the mixture to dissolve the mixture so that the solid contents of the mixture became 20 parts by weight of the resulting solution. Next, the solution was filtered using a MILLIPORE® filter having a pore size of 0.2 micrometers to produce the photosensitive composition.

Experimental Example 2

The photosensitive composition was prepared by the same method as Experimental Example 1, except that, in producing the photosensitive composition, dioctyladipate was used instead of dioctylphthalate as a plasticizer.

Experimental Example 3

The photosensitive composition was prepared following the same method as Experimental Example 1, except that, in producing the photosensitive composition, tricresylphospate was used instead of dioctylphthalate as a plasticizer.

Experimental Example 4

The photosensitive composition was prepared following the same method as Experimental Example 1, except that, in producing the photosensitive composition, 2,2,4-trimethyl-1, 3-pentanediol monoisobutyrates were used instead of dioctylphthalate as a plasticizer.

Comparative Experimental Example 1

The photosensitive composition was prepared following the same method as Experimental Example 1, except that, in producing the photosensitive composition, no plasticizer was used.

Comparative Experimental Example 2

The photosensitive composition was prepared following the same method as Experimental Example 1, except that, in producing the photosensitive composition, 30 parts by weight of dioctylphthalate instead of 15 parts by weight of dioctylphthalate were used.

(Fabricating a Thin Film Transistor Substrate Including an Organic Insulating Film Pattern and Evaluating the Performance Thereof)

The photosensitive composition produced by Experimental Examples 1 to 4, Comparative Experimental Example 1 and Comparative Experimental Example 2 were applied to insulating substrates, with data wires formed thereon, using a spin coater. The substrates were then pre-baked over a hot plate for 2 minutes at a temperature of 90° C., thereby forming an organic insulating film having a thickness of 3.0 micrometers.

Uniformity After Developing

The uniformity of the organic insulating film after developing was measured using an Ellipsometer. The results are reported in Table 1. Results where uniformity was observed to be over 95%, based on the whole insulating substrate, are indicated by "○" in Table 1. Results where uniformity was observed to be 90-95% are indicated by "Δ" in Table 1, and where uniformity was observed to be less than 90% are indicated by × in Table 1.

Sensitivity

Ultraviolet light having of intensity of 20 milliwatts per square centimeter ($mW/cm^2$) at 435 nanometers (nm) was irradiated on an organic insulating film. In this case a pattern was formed by irradiating with ultraviolet light such that the aperture and the light-shielding pattern of a mask are within 10 micrometers of each other. Next, the organic insulating film was developed using an aqueous solution including 2.38 parts by weight of tetramethyl ammonium hydroxide for 1 minute at 23° C., and rinsed using deionized water for 1 minute.

Next, 500 millijoules per square centimeter ($mJ/cm^2$) of ultraviolet light having an intensity of 20 milliwatts per square centimeter ($mW/cm^2$) at 435 nanometers (nm) was irradiated on the developed pattern, and cured for 60 minutes at 230° C., thereby producing an organic insulating film pattern.

Resolution

The minimum size of the organic insulating film pattern formed during measurement of the sensitivity is reported in Table 1.

Heat-Resistance

The width of an organic insulating film pattern was measured at four places, specifically at the top, bottom, left and right portions of the organic insulating film pattern, during the sensitivity measurement described above. Where the rate of angle change before midbake and thereafter was 0 to 20 percent is indicated ○, 20-40% is indicated by Δ, and over 40% is indicated by × in Table 1.

Transmittance

The transmittance of a 400 nanometer (nm) thick pattern layer was measured using a photoelectric spectrophotometer.

TABLE 1

| | Uniformity after developing | Sensitivity (mJ/cm$^2$) | Resolution (μm) | Heat Resistance | Transmittance (%) |
|---|---|---|---|---|---|
| Experimental Example 1 | ○ | 230 | 3 | ○ | 90 |
| Experimental Example 2 | ○ | 240 | 3 | ○ | 90 |
| Experimental Example 3 | ○ | 250 | 3 | ○ | 90 |
| Experimental Example 4 | ○ | 260 | 3 | ○ | 90 |
| Comparative Experimental Example 1 | ○ | 300 | 3 | ○ | 90 |
| Comparative Experimental Example 2 | ○ | 240 | 3 | x | 90 |

Uniformity: "○" = over 95%
Heat Resistance: "○" = Rate of angle change 0 to 20 percent; "x" = Rate of angle change over 40 percent.

As can be understood from Table 1, the photosensitive compositions produced by Experimental Examples 1 to 4 have unexpectedly good uniformity, resolution, heat-resistance, and transmittance after being developed. In particular, the light sensitivity of the photosensitive composition was better than Comparative Experimental Example 1, thereby enabling a reduction of the process time. In the case of Comparative Experimental Example 2, the sensitivity was good, but heat-resistance was poor. Thus the organic insulating films prepared using the disclosed photosensitive composition provide sensitivity and heat resistance not observed in the comparative examples without reduction in uniformity, resolution or transmittance performance.

As described above, the disclosed organic insulating films are applicable to the manufacture of thin film transistor substrates disclosed in the exemplary embodiments.

In particular, an organic insulating film pattern can be formed using the photosensitive composition. The photosensitive composition has good light sensitivity, thus the process time for fabricating a thin film transistor substrate can be reduced.

In addition, a thin film transistor substrate can be fabricated using the disclosed photosensitive composition. Because the organic insulating film can provide impact strength, the organic insulating film can enhance the impact resistance of a thin film transistor or thin film transistor substrate.

Also, an organic insulating film pattern of a thin film transistor substrate formed using the disclosed photosensitive composition can have good uniformity, resolution, heat-resistance, and transmittance.

Although exemplary embodiments have been described in detail with reference to the accompanying drawings for the purpose of illustration, it will be understood by those skilled in the art that various changes can be made and equivalents can be substituted for elements thereof without departing from the scope of the invention. In addition, many modifications can be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Thus it will be apparent to those of ordinary skill in the art that various modifications to the foregoing exemplary embodiments can be made without departing from the scope of the invention as defined by the appended claims, with equivalents of the claims to be included therein. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

The endpoints of all ranges directed to the same component or property are inclusive of the endpoint and independently combinable.

What is claimed is:

1. A method of fabricating a thin film transistor substrate, the method comprising:
   forming data wires on an insulating substrate;
   forming an organic insulating film on the data wires by applying a photosensitive composition, wherein the photosensitive composition comprises a terpolymer, about 5 to about 100 parts by weight of a positive type photosensitizer, based on 100 parts by weight of the terpolymer, about 5 to about 20 parts by weight of a plasticizer, based on 100 parts by weight of the terpolymer, and about 50 to about 90 parts by weight of a solvent, based on 100 parts by weight of the photosensitive composition, wherein the terpolymer is derived from an unsaturated carboxylic acid, an unsaturated carboxylic acid anhydride, or a mixture thereof, and an unsaturated epoxy group-containing compound and an olefinic compound;
   patterning contact holes in the organic insulating film; and
   forming pixel electrodes in the organic insulating film, the pixel electrodes being in electrical communication with the data wires via the contact holes.

2. The method of claim 1, wherein the terpolymer is formed by:
   copolymerizing an unsaturated carboxylic acid, an unsaturated carboxylic acid anhydride, or a mixture thereof, an unsaturated epoxy group-containing compound, and an olefinic compound; and
   removing unreacted monomers.

3. The method of claim 2, wherein the unsaturated carboxylic acid, unsaturated carboxylic acid anhydride, or the mixture thereof, is about 5 to about 40 parts by weight, the unsaturated epoxy group-containing compound is about 10 to about 70 parts by weight, and the olefinic compound is about 5 to about 70 parts by weight, based on 100 parts by weight of the unsaturated carboxylic acid, unsaturated carboxylic anhydride, unsaturated epoxy group-containing compound and the olefinic compound.

4. The method of claim 1, wherein patterning the contact holes in the organic insulating film comprises:
   exposing the organic insulating film to light using a mask; and
   developing the organic insulating film in a developer solution.

5. The method of claim 4, wherein a light sensitivity of the organic insulating film is from about 200 to about 270 millijoules per square centimeter (mJ/cm$^2$).

6. The method of claim 4, wherein the developer solution comprises about 0.1 to about 10 parts by weight of an alkali compound and about 90 to about 99.9 parts by weight of water.

7. The method of claim 6, wherein the alkali compound is selected from the group consisting of sodium hydroxide, potassium hydroxide and sodium carbonate, ethylamine n-propylamine; diethylamine, n-propylamine, trimethylamine, methyldiethylamine, dimethylethylamine triethylamine; alcoholamines, dimethylethanolamine, methyldiethanolamine triethanolamine, tetramethylammonium hydroxide tetraethylammonium hydroxide, and a combination comprising at least one of the foregoing alkali compounds.

8. The method of claim 1, wherein the plasticizer is selected from the group consisting of a phthalate, an adipate, a phosphate, a monoisobutyrate, and a combination comprising at least one of the foregoing plasticizers.

9. The method of claim 8, wherein the phthalate plasticizer is selected from the group consisting of dioctylphthalate, diisononylphthalate, and a combination comprising at least one of the foregoing phthalates.

10. The method of claim 8, wherein the adipate plasticizer is dioctyladipate.

11. The method of claim 8, wherein the phosphate plasticizer is tricresylphospate.

12. The method of claim 8, wherein the monoisobutyrate plasticizer is 2,2,4-trimethyl-1,3-pentanediol monoisobutyrate.

13. The method of claim 1, wherein the plasticizer is selected from the group consisting of an adipate, a monoisobutyrate, and a combination comprising at least one of the foregoing plasticizers.

* * * * *